United States Patent
Lee et al.

(10) Patent No.: US 10,626,326 B2
(45) Date of Patent: Apr. 21, 2020

(54) METHOD FOR MANUFACTURING PEROVSKITE NANOCRYSTAL PARTICLE LIGHT EMITTING BODY WHERE ORGANIC LIGAND IS SUBSTITUTED, NANOCRYSTAL PARTICLE LIGHT EMITTING BODY MANUFACTURED THEREBY, AND LIGHT EMITTING DEVICE USING SAME

(71) Applicant: POSTECH ACADEMY-INDUSTRY FOUNDATION, Pohang-si, Gyeongsangbuk-do (KR)

(72) Inventors: Tae-Woo Lee, Pohang-si (KR); Sanghyuk Im, Hwaseong-si (KR); Young-Hoon Kim, Daegeon (KR); Himchan Cho, Daegu (KR)

(73) Assignees: POSTECH ACADEMY-INDUSTRY FOUNDATION (KR); Tae-Woo Lee (KR)

( * ) Notice: Subject to any disclaimer, the term of this patent is extended or adjusted under 35 U.S.C. 154(b) by 0 days.

(21) Appl. No.: 15/524,476

(22) PCT Filed: Nov. 6, 2015

(86) PCT No.: PCT/KR2015/011961
§ 371 (c)(1),
(2) Date: Jul. 26, 2017

(87) PCT Pub. No.: WO2016/072807
PCT Pub. Date: May 12, 2016

(65) Prior Publication Data
US 2017/0369772 A1 Dec. 28, 2017

(30) Foreign Application Priority Data

Nov. 6, 2014 (KR) .................... 10-2014-0153974
Nov. 6, 2015 (KR) .................... 10-2015-0156179

(51) Int. Cl.
*H01L 51/50* (2006.01)
*H01G 9/20* (2006.01)
(Continued)

(52) U.S. Cl.
CPC ............ *C09K 11/06* (2013.01); *C09K 11/025* (2013.01); *H01G 9/2004* (2013.01);
(Continued)

(58) Field of Classification Search
CPC ... C09K 11/06; C09K 11/025; H01L 51/0077; H01L 51/0003; H01L 51/5032; H01L 51/4253; H01G 9/2004
See application file for complete search history.

(56) References Cited

U.S. PATENT DOCUMENTS 7,601,859 B2 * 10/2009 Christou ................. C07F 5/022
534/15
2004/0061136 A1 * 4/2004 Tyan ................... H01L 51/5268
257/200

(Continued)

FOREIGN PATENT DOCUMENTS

JP 2003-309308 10/2003
KR 10-2001-0015084 2/2001

OTHER PUBLICATIONS

Stoumpos, C. C. et al., Crystal Growth of the Perovskite Semiconductor CsPbBr3: A New Material for High-Energy Radiation Detection, Crystal Growth & Design, 2013, vol. 13, No. 7, pp. 2722-2727.
(Continued)

*Primary Examiner* — Allen L Parker
*Assistant Examiner* — Gustavo G Ramallo
(74) *Attorney, Agent, or Firm* — Renaissance IP Law Group LLP

(57) ABSTRACT

Provided are a method for manufacturing a perovskite particle light-emitter where an organic ligand is substituted,
(Continued)

a light-emitter manufactured thereby, and a light emitting device using the same. A method for manufacturing an hybrid perovskite particle light-emitter where an organic ligand is substituted may comprise the steps of: preparing a solution including an hybrid perovskite particle light-emitter, wherein the hybrid perovskite particle light-emitter comprises an halide perovskite nanocrystal structure and a plurality of first organic ligands surrounding the perovskite nanocrystal structure; and adding, to the solution, a second organic ligand which is shorter than the first organic ligands or includes a phenyl group or a fluorine group, thereby substitutes the first organic ligands with the second organic ligand. Thus, since energy transfer or charge injection into the nanocrystal structure increases through ligand substitution, it is possible to further increase light emitting efficiency and increase durability and stability by means of a hydrophobic ligand.

13 Claims, 9 Drawing Sheets

(51) Int. Cl.
  *C09K 11/06* (2006.01)
  *C09K 11/02* (2006.01)
  *H01L 51/00* (2006.01)
  *H01L 51/42* (2006.01)

(52) U.S. Cl.
  CPC ...... *H01L 51/0003* (2013.01); *H01L 51/0077* (2013.01); *H01L 51/5032* (2013.01); *C09K 2211/188* (2013.01); *H01L 51/4253* (2013.01); *H01L 51/5012* (2013.01)

(56) References Cited

U.S. PATENT DOCUMENTS

| | | | | |
|---|---|---|---|---|
| 2006/0159611 | A1* | 7/2006 | Hummelen | B82Y 10/00 423/445 B |
| 2008/0296555 | A1* | 12/2008 | Miller | C09K 11/025 257/14 |
| 2017/0125747 | A1* | 5/2017 | Lee | C09K 11/06 |
| 2017/0186922 | A1* | 6/2017 | Kim | C09K 11/703 |
| 2018/0312754 | A1* | 11/2018 | Pan | C09K 11/664 |

OTHER PUBLICATIONS

Mitzi, D. B. et al., Organic-Inorganic Electronics, IBM Journal of Research and Development, Jan. 2001, vol. 45, No. 1, pp. 29-45.
Schmidt, L. C. et al., Nontemplate Synthesis of CH3NH3PbBr3 Perovskite Nanoparticles, Journal of the American Chemical Society, 2014, vol. 136, No. 3, pp. 850-853, Jan. 3, 2014.
KIPO, International Search Report, Application No. of PCT/KR2015/011961, dated Mar. 10, 2016.

* cited by examiner (a)

(b)

110  110

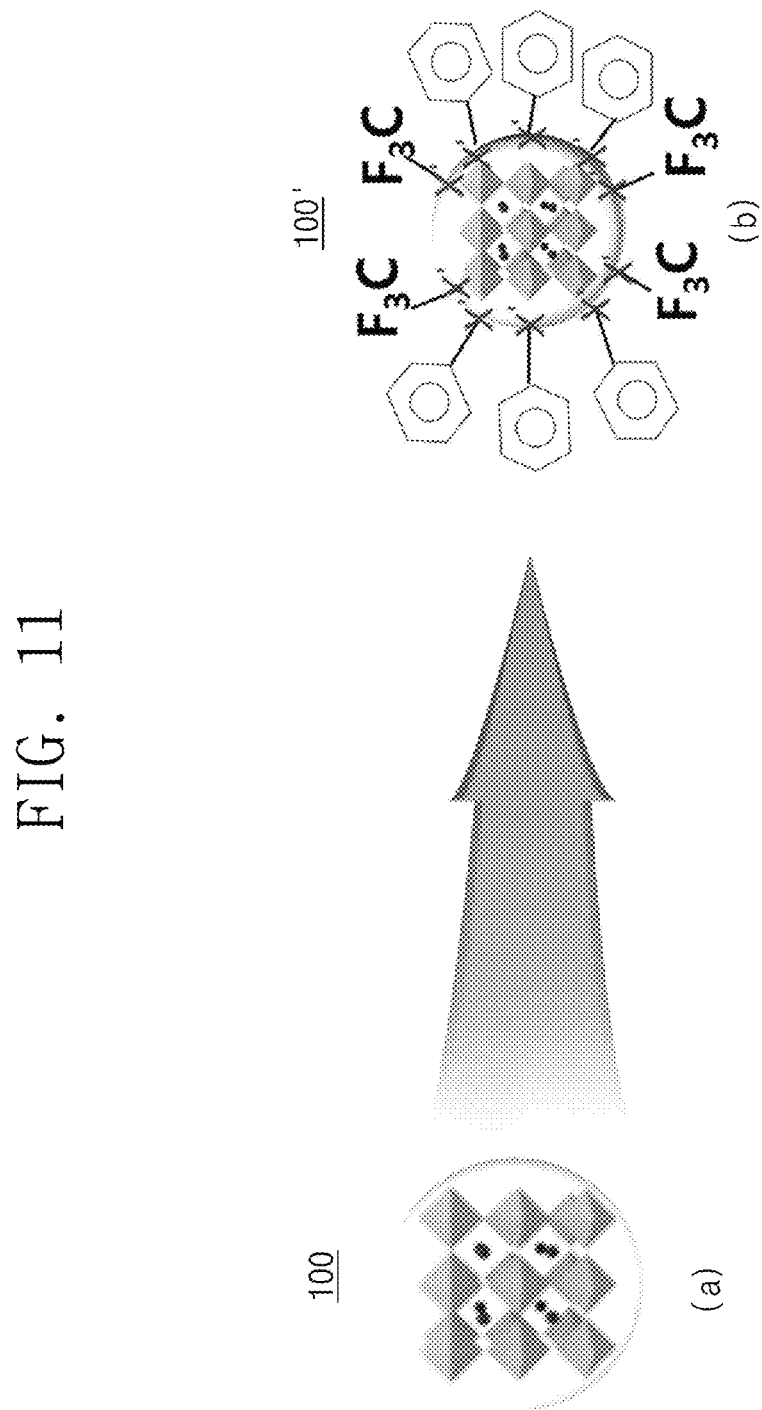

METHOD FOR MANUFACTURING PEROVSKITE NANOCRYSTAL PARTICLE LIGHT EMITTING BODY WHERE ORGANIC LIGAND IS SUBSTITUTED, NANOCRYSTAL PARTICLE LIGHT EMITTING BODY MANUFACTURED THEREBY, AND LIGHT EMITTING DEVICE USING SAME

TECHNICAL FIELD

The present invention relates to a light-emitter and a light emitting device using the same, and more particularly, to a method for manufacturing an hybrid perovskite or an inorganic metal halide perovskite particle light-emitter where an organic ligand is substituted, a particle light-emitter manufactured thereby, and a light emitting device using the same.

BACKGROUND ART

The major trend of the display market is shifting from the existing high-efficiency and high-resolution-oriented display, to the emotional image-quality display aiming at realizing a high color purity for demonstration of natural colors. In this respect, organic light-emitter-based organic light emitting diode (OLED) devices have remarkably developed, inorganic quantum dot LEDs with the improved color purity have been actively researched and developed as alternatives. However, in the viewpoint of emitting materials, both the organic light-emitters and the inorganic quantum dot light-emitters have intrinsic limitations.

The existing organic light-emitters have an advantage of high efficiency, but the existing organic light-emitters have a wide spectrum and poor color purity. Although the inorganic quantum dot light-emitters have been known to have good color purity because the luminescence occurs by quantum size effects, there is a problem that it is difficult to uniformly control the sizes of the quantum dots as the color approaches the blue color, and thereby the size distribution deteriorates the color purity. Furthermore, because the inorganic quantum dots have a very deep valence band, there is a problem that it is difficult to inject holes because a hole injection barrier from an organic hole injection layer or an anode is too large. Also, the two light-emitter are disadvantageously expensive. Thus, there is a need for new types of hybrid light-emitters that compensate for the disadvantages of the organic light-emitters and inorganic quantum dot emitters and maintains their merits.

Since the hybrid light materials have advantages of low manufacturing costs and simple manufacturing and device manufacturing processes and also have all advantages of organic emitting materials, which are easy to control optical and electrical properties, and inorganic emitting materials having high charge mobility and mechanical and thermal stability, the hybrid emitting materials are attracting attention academically and industrially.

Among them, since the hybrid perovskite materials (hereafter, hybrid perovskite) have high color purity (full width at half maximum (FWHM)≈20 nm), simple color control, and low synthesis costs, the hybrid perovskite materials are very likely to be developed as the light-emitter. Since the high color purity from these materials can be realized because they have a layered structure in which a two-dimensional (2D) plane made of the inorganic material is sandwiched between 2D planes made of the organic material, and a large difference in dielectric constant between the inorganic material and the organic material is large ($\varepsilon_{organic} \approx 2.4$, $\varepsilon_{inorganic} \approx 6.1$) so that the electron-hole pairs (or excitons) are bound to the inorganic 2D layer.

A material having the conventional perovskite structure ($ABX_3$) is inorganic metal oxide.

In general, the inorganic metal oxides are oxides, for example, materials in which metal (alkali metals, alkali earth metals, lanthanides, etc) cations such as Ti, Sr, Ca, Cs, Ba, Y, Gd, La, Fe, and Mn, which have sizes different from each other, are located in A and B sites, oxygen anions are located in an X site, and the metal cations in the B site are bonded to the oxygen anions in the X site in the corner-sharing octahedron form with the 6-fold coordination. Examples of the inorganic metal oxides include $SrFeO_3$, $LaMnO_3$, $CaFeO_3$, and the like.

On the other hand, since the hybrid perovskite has the $ABX_3$ in which organic ammonium ($RNH_3$) cations (or "A site cation" in perovskite crystals) are located in the A site, and halides (Cl, Br, I) are located in the X site to form the organic metal halide perovskite material, the hybrid perovskite are completely different from the inorganic metal oxide perovskite material in composition.

In addition, the materials vary in characteristics due to a difference in composition of the materials. The inorganic metal oxide perovskite typically has characteristics of superconductivity, ferroelectricity, colossal magnetoresistance, and the like, and thus has been generally conducted to be applied for sensors, fuel cells, memory devices, and the like. For example, yttrium barium copper oxides have superconducting or insulating properties according to oxygen contents.

On the other hand, since the hybrid perovskite (or inorganic metal halide perovskite) has a structure in which the organic planes ((or "A site cation" plane in the perovskite crystal structure)) and the inorganic planes are alternately stacked and thus has a structure similar to a lamellar structure so that the excitons are bound in the inorganic plane, it may be an ideal light-emitter that generally emits light having very high purity by the crystal structure itself rather than the quantum size effect of the material.

If the hybrid perovskite has a chromophore (mainly including a conjugated structure) in which organic ammonium has a bandgap less than that of a crystal structure composed of a central metal and a halogen crystal structure ($BX_6$), the luminescence occurs in the organic ammonium. Thus, since light having high color purity is not emitted, a full width at half maximum of the luminescence spectrum becomes wider than 50 nm. Therefore, the hybrid perovskite are unsuitable for a light emitting layer. Thus, in this case, it is not very suitable for the light-emitter having the high color purity, which is highlighted in this patent. Therefore, in order to produce the light-emitter having the highcolor purity, it is important that the luminescence occurs in an inorganic lattice composed of the central metal-halogen elements without the organic ammonium which contain the chromophore. That is, this patent focuses on the development of the light-emitter having high color purity and high efficiency in the inorganic lattice. For example, although an electroluminescent device in which a dye-containing hybrid material is formed in the form of a thin film rather than that of a particle and used as a light emitting layer, the emission originated from the emitting dye itself, not the intrinsic crystal structure as disclosed in Korean Patent Publication No. 10-2001-0015084 (Feb. 26, 2001), light is not emitted from the perovskite lattice structure.

However, since the hybrid perovskite has small exciton binding energy, there is a fundamental problem that the luminescence occurs at a low temperature, but the excitons do not efficiently emit light at room temperature due to thermal ionization and delocalization of charge carriers and thus are separated into free charge carriers and then annihilated. Also, there is a problem in that the excitons are annihilated by the layer having high conductivity in the vicinity of the excitons when the free charges are recombined again to form excitons. Therefore, to improve light emission efficiency and brightness of the hybrid or metal halide perovskite-based LED, it is necessary to prevent the excitons from being quenched.

DISCLOSURE OF THE INVENTION

Technical Problem

To solve the abovementioned problems, the present invention provides a particle light-emitter having improved luminescent efficiency and durability (or stability) by synthesizing hybrid perovskite or inorganic metal halide perovskite into nanocrystal made of at least ternary compounds in unit crystal (≥3 components) (i.e. perovskite structure) instead of forming a polycrystal thin film in order to prevent thermal ionization, delocalization of charge carriers, and quenching of excitons, and a light emitting device using the same.

Furthermore, the present invention provides a particle light-emitter in which an organic ligand surrounding a hybrid perovskite or inorganic metal halide perovskite nanocrystal structure is substituted with a ligand having a short length or a ligand including a phenyl group or a fluorine group to more improve light emitting efficiency and a light emitting device using the same.

Technical Solution

To achieve the objectives, one aspect of the present invention provides a method for manufacturing a hybrid perovskite particle light-emitter, in which an organic ligand is substituted. The method for manufacturing the hybrid perovskite particle light-emitter, in which the organic ligand is substituted, includes steps of: preparing a solution including the hybrid perovskite particle light-emitters that have an halide perovskite nanocrystal structure and a plurality of first organic ligands surrounding a surface of the hybrid or metal halide perovskite nanocrystal structure substitutionally or separately; and adding a second organic ligand, which has a length less than that of each of the first organic ligands or includes a phenyl group or fluorine group, to the solution to substitute the first organic ligand with the second organic ligand.

Also, each of the first organic ligand and the second organic ligand may include alkyl halide, and a halogen element of the second organic ligand may include an element having affinity higher than that of a halogen element of the first organic ligand with respect to a center metal (B site) or A site of the halide perovskite nanocrystal structure.

Also, the hybrid perovskite particle may have a size of 1 nm to 900 nm.

Also, the hybrid perovskite particle may have bandgap energy determined by the crystal structure without depending on a particle size.

Also, the preparing of the solution including the hybrid perovskite particle light-emitter may include steps of: preparing a first solution in which hybrid perovskite is dissolved in a polar solvent and a second solution in which an alkyl halide surfactant is dissolved in a non-polar solvent; and mixing the first solution with the second solution to form the hybrid perovskite particle light-emitter.

Also, the hybrid perovskite may include a structure of $ABX_3$, $A_2BX_4$, $AnBX_{2+n}$, $ABX_4$, $A_2BB'X_6$, or $A_{n-1}Pb_nX_{3n+1}$ (where n is an integer between 2 to 6, and the A may be an organic ammonium or inorganic alkali metal material, the B may be a metal material, and the X may be a halogen element. Also, the A may be $(CH_3NH_3)_n$, $((C_xH_{2x+1})_nNH_2)(CH_2NH_3)_n$, $(NH_2)_2$, $(C_nH_{2n+1}NH_3)_2$, $CF_3NH_3$, $(CF_3NH_3)_n$, $((C_xF_{2x+1})_nNH_2)_2(CF_2NH_3)_n((C_xF_{2x+1})_nNH_3)$, $(C_nF_{2n+1}NH_3)$, $(CH(NH_2)_2)$, $C_xH_{2x+1}(C(NH_2)_2)$ Cs, Rb, K, or derivative thereof (R is alkyl or fluoroalkyl, where n is an integer equal to or greater than 1, and x is an integer equal to or greater than 1), the B or B' may be a divalent transition metal, a rare earth metal, an alkali earth metal, Pb, Sn, Ge, Ga, In, Al, Sb, Bi, Po, or a combination thereof, and the X may be Cl, Br, I, or a combination thereof.

To achieve the objectives, another aspect of the present invention provides a hybrid perovskite particle light-emitter, in which an organic ligand is substituted. The hybrid perovskite particle light-emitter, in which the organic ligand is substituted, may be manufactured by the abovementioned method.

The hybrid perovskite particle light-emitter, in which an organic ligand is substituted, may be dispersible in an organic solvent.

The organic solvent may include a polar solvent and a non-polar solvent, the polar solvent may include dimethylformamide, gamma butyrolactone, N-methylpyrrolidone, dimethylsulfoxide or isopropyl alcohol, and the non-polar solvent may include dichloroethylene, trichlorethylene, chloroform, chlorobenzene, dichlorobenzene, styrene, xylene, toluene, or cyclohexene.

To achieve the objectives, another aspect of the present invention provides a light emitting device. The light emitting device includes: a first electrode; a second electrode; and a light emitting layer disposed between the first electrode and the second electrode and including the abovementioned hybrid perovskite particle light-emitter, in which the organic ligand is substituted.

To achieve the objects, another aspect of the present invention provides a method for manufacturing an inorganic metal halide perovskite particle light-emitter, in which an organic ligand is substituted. The method for manufacturing an inorganic metal halide perovskite particle light-emitter, in which the organic ligand is substituted, includes steps of: preparing a solution including the inorganic metal halide perovskite particle light-emitters that have an inorganic metal halide perovskite nanocrystal structure and a plurality of first organic ligands surrounding a surface of the inorganic metal halide perovskite nanocrystal structure; and adding a second organic ligand, which has a length less than that of each of the first organic ligands or includes a phenyl group or fluorine group, to the solution to substitute the first organic ligand with the second organic ligand.

To achieve the objectives, another aspect of the present invention provides a solar cell. The solar cell includes: a first electrode; a second electrode; and a photoactive layer disposed between the first electrode and the second electrode and including the abovementioned hybrid perovskite particle light-emitter, ligand is substituted.

Each of the first organic ligand and the second organic ligand may include alkyl halide, and a halogen element of the second organic ligand may include an element having affinity equal to or higher than that of a halogen element of the first organic ligand with respect to a center metal (B site) or A site of the halide perovskite nanocrystal structure. The inorganic metal halide perovskite may include a structure of $ABX_3$, $A_2BX_4$, $ABX_4$, $A_nBX_{2+n}$ $A_2BB'X_6$, or $A_{n-1}Pb_nX_{3n+1}$ (where n is an integer between 2 to 6), and the A may be an alkali metal, the B may be a metal material, and the X may be a halogen element.

Here, the A may be Na, K, Rb, Cs, or Fr, the B may be B may be a divalent transition metal, a rare earth metal, an alkali earth metal, Pb, Sn, Ge, Ga, In, Al, Sb, Bi, Po, or a combination thereof, and the X may be Cl, Br, I, or a combination thereof.

Advantageous Effects

In the particle light-emitters that have the hybrid perovskite (or the inorganic metal halide perovskite) nanocrystal structure, the hybrid perovskite having the crystal structure, in which the FCC and the BCC are combined with each other, may be formed in the particle light-emitter to form a lamellar structure in which the organic plane (or "A site cation" plane in the perovskite crystal structure) and the inorganic plane are alternately stacked, and also, the excitons may be confined in the inorganic plane to implement the high color purity.

Also, the exciton diffusion length may be reduced, and the exciton binding energy may increase in the nanocrystal structure having a size of 900 nm or less to prevent the excitons from being annihilated by thermal ionization and the delocalization of the charge carriers, thereby improving the luminescent efficiency at room temperature.

Furthermore, when compared to the hybrid perovskite having the 3D structure such as the $ABX_3$ structure, the halide perovskite nanocrystal having the 2D structure such as the $A_2BX_4$, $ABX_4$, $A_{n-1}B_nX_{3n+1}$ structure may be synthesized to increase the distance between the inorganic planes confined in the excitons, resulting in increasing in the exciton binding energy, thereby improving the luminescent efficiency and the durability (or stability).

Also, the bandgap energy of the hybrid perovskite particle may be determined by the crystal structure without depending on the particle size.

Also, the organic or inorganic ligand surrounding the hybrid perovskite or inorganic metal halide perovskite nanocrystal structure substitutionally or separately may be substituted with the ligand having the short length or the ligand including the phenyl group or the fluorine group to more increase the energy transfer or the charge injection in the nanocrystal structure, thereby improving the luminescent efficiency and the durability (or stability) by the hydrophobic ligands.

The effects of the present invention are not limited to the aforementioned effects, but other objects not described herein will be clearly understood by those skilled in the art from descriptions below.

BRIEF DESCRIPTION OF THE DRAWINGS

FIG. 11 is a schematic view of the hybrid perovskite Particle light-emitter, in which the organic ligand is substituted, according to an embodiment of the present invention.

MODE FOR CARRYING OUT THE INVENTION

Hereinafter, embodiments of the present invention will be described in detail with reference to the accompanying drawings.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

In the following description, it will be understood that when an element such as a layer, a region, or substrate is referred to as being 'on' another layer, region, or substrate, it can be directly on the other layer, region, or substrate, or intervening layers, regions, or substrates may also be present.

Although the terms such as "first," "second," etc., are used to describe various element, components, regions, layers, and/or portions, it is obvious that the elements, components, regions, layers, and/or portions should not be defined by these terms.

Figure 1:
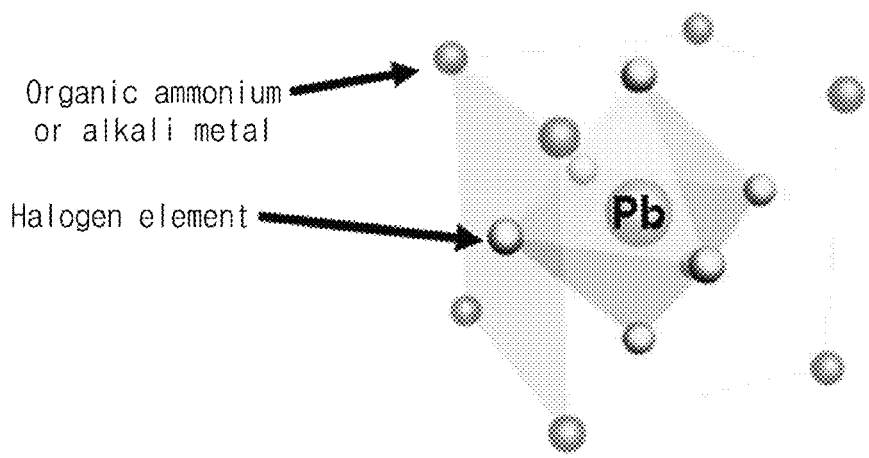
FIG. 1 is a schematic view of a perovskite nanocrystal structure according to an embodiment of the present invention.

FIG. 1 is a schematic view of a perovskite nanocrystal structure according to an embodiment of the present invention.

FIG. 1 illustrates structures of a halide perovskite nanocrystal and an inorganic metal halide perovskite nanocrystal.

Referring to FIG. 1 the halide perovskite nanocrystal has a structure with a center metal centered in a face centered cubic (FCC), in which six inorganic halide materials X are respectively located on all surfaces of a hexahedron, and in a body centered cubic (BCC), in which eight organic ammonium OA are respectively located at all vertexes of a hexahedron. Here, Pb is illustrated as an example of the center metal.

Also, the inorganic metal halide perovskite nanocrystal has structure with a center metal centered in a face centered cubic (FCC), in which six inorganic halide materials X are respectively located on all surfaces of a hexahedron, and in a body centered cubic (BCC), in which eight alkali metals are respectively located at all vertexes of a hexahedron. Here, Pb is illustrated as an example of the center metal.

Here, all sides of the hexahedron have an angle of 90° with respect to each other. The above-described structure may include a cubic structure having the same length in horizontal, vertical, and height directions and a tetragonal structure having different lengths in the horizontal, vertical, and height directions.

Thus, a two-dimensional (2D) structure according to According to the present invention may be the halide perovskite nanocrystal structure with a center metal centered in a face centered cubic, in which six inorganic halide materials X are respectively located on all surfaces of a hexahedron, and in a body centered cubic, in which eight organic ammonium are respectively located at all vertexes of a hexahedron and be defined as a structure of which a horizontal length and a vertical length are the same, but a height length is longer by 1.5 times or more than each of the horizontal length and the vertical length.

A method for manufacturing the hybrid perovskite particle light-emitter, in which the organic ligand is substituted, according to an embodiment of the present invention will be described.

Figure 2:
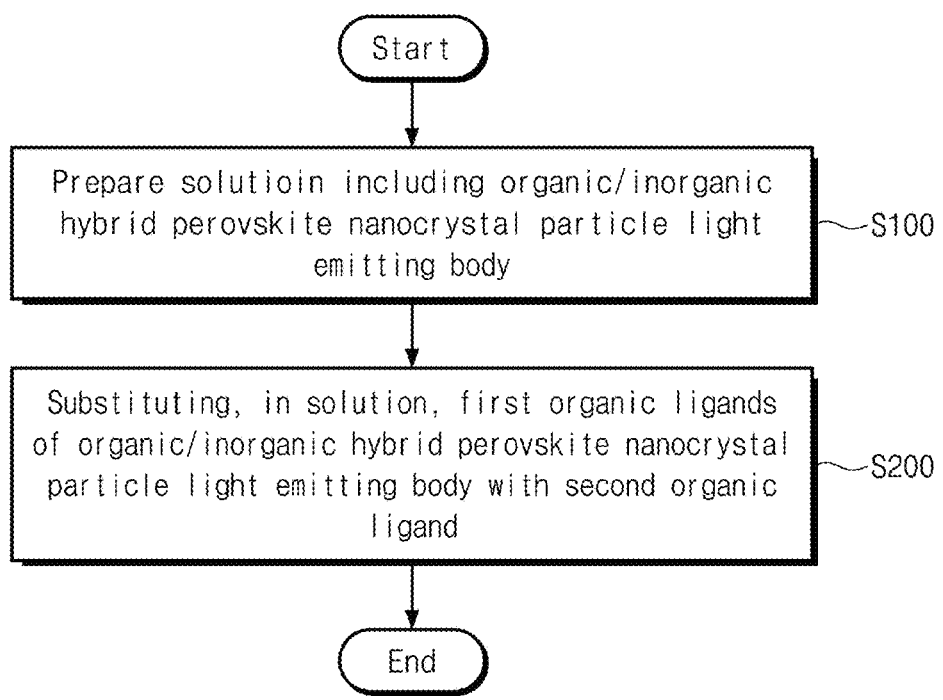
FIG. 2 is a flowchart illustrating a method for manufacturing the hybrid perovskite particle light-emitter, in which an organic ligand is substituted, according to an embodiment of the present invention.

FIG. 2 is a flowchart illustrating a method for manufacturing the hybrid perovskite particle light-emitter, in which an organic ligand is substituted, according to an embodiment of the present invention.

Referring to FIG. 2, the method for manufacturing the hybrid perovskite particle light-emitter, in which an organic ligand is substituted, includes a step (S100) of preparing a solution including a halide perovskite nanocrystal light-emitter and a step (S200) of substituting a first organic ligand of the halide perovskite nanocrystal light-emitter with a second organic ligand in the solution.

In more detail, first, a solution including an halide perovskite nanocrystal light-emitter is prepared (S100). The hybrid perovskite nanocrystal light-emitter may include a plurality of first organic ligands surrounding a hybrid or metal halide perovskite nanocrystal structure and the halide perovskite nanocrystal structure.

The step of preparing the solution including the hybrid perovskite nanocrystal light-emitter may be a step of manufacturing and preparing the hybrid perovskite nanocrystal light-emitter. One manufacturing example will be described with reference to FIGS. 3 to 5.

Figure 3:
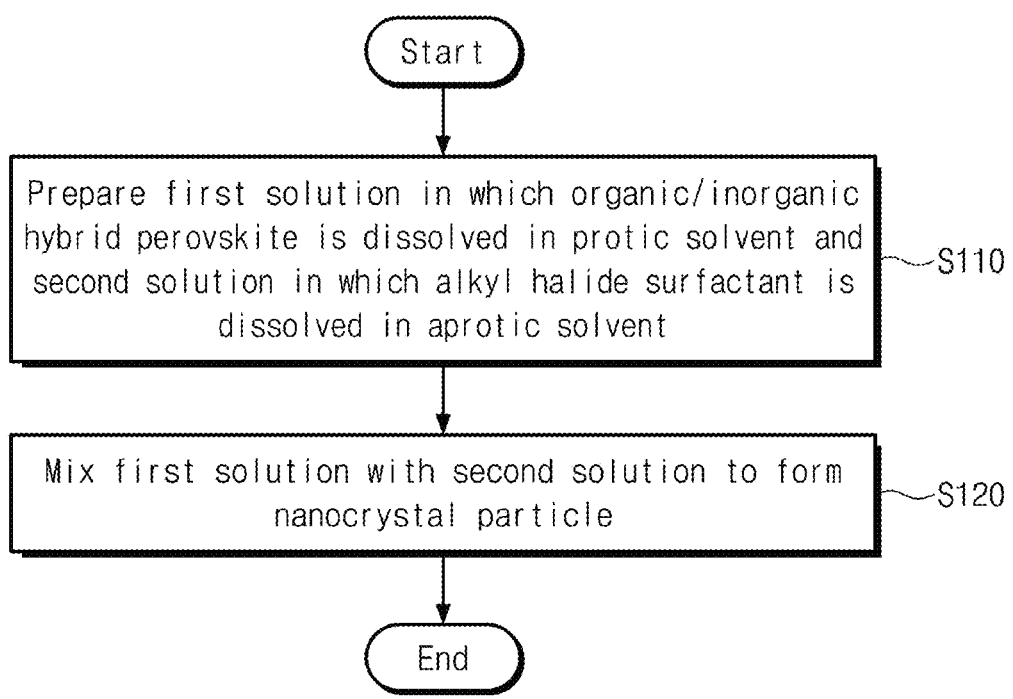
FIG. 3 is a flowchart illustrating a method for manufacturing the hybrid perovskite particle light-emitter according to an embodiment of the present invention.

FIG. 3 is a flowchart illustrating a method for manufacturing the hybrid perovskite particle light-emitter according to an embodiment of the present invention.

Referring to FIG. 3, the hybrid perovskite particle light-emitter according to the present invention may be manufactured through an inverse nano-emulsion method, reprecipitation method, or hot injection method.

First, the first solution in which the hybrid perovskite is dissolved in a polar solvent and the second solution in which a surfactant is dissolved in a non-polar solvent are prepared (S110).

Here, the polar (aprotic or protic) solvent may include dimethylformamide, gamma butyrolactone, N-methylpyrrolidone, dimethylsulfoxide or isopropyl alcohol, but is not limited thereto.

Also, the hybrid perovskite may be a material having a 2D crystalline structure, a 3D crystalline structure or a combination thereof.

For example, the hybrid perovskite having the 3D crystal structure may be an $ABX_3$ structure. Also, the hybrid perovskite having the 2D crystal structure may be a structure of $ABX3$, $A2BX4$, $ABX4$, $AnBX2+nr$ $A2BB'X6$, or $An-1PbnX3n+1$ (where n is an integer between 2 to 6).

Here, the A is an organic ammonium or inorganic alkali metal material, the B is a metal material, and the X is a halogen element.

For example, the A may be $(CH3NH3)_{nr}$ $(CxH2x+1)$ $nNH2)$ $(CH_2NH_3)_n$, $R(NH_2)_2$, $(CnH2n+1NH3)2$, $CF3NH3$, $(CF3NH3)_{nr}$ $(C_xF_{2x+1})_nNH_2)_2(CF_2NH_3)$ $((CxF2x+1)$ $nNH3)$, $(CnF2n+1NH3)$, $(CH(NH2)2)$, $CxH_2x+1$ $(C(NH_2)$ 2), Cs, Rb, K, metal or derivative thereof (R is alkyl or fluoroalkyl, where n is an integer equal to or greater than 1, and x is an integer equal to or greater than 1). Here, the B may be a divalent transition metal, a rare earth metal, an alkali earth metal, Pb, Sn, Ge, Ga, In, Al, Sb, Bi, Po, or a combination thereof. Here, the rare earth metal may be, for example, Ge, Sn, Pb, Eu, or Yb. Also, the alkali earth metal may be, for example, Ca or Sr. Also, the X may be Cl, Br, I, or a combination thereof.

The perovskite may be prepared by combining the AX with $BX_2$ at a predetermined ratio. That is, the first solution may be formed by dissolving the AX and $BX_2$ in the polar solvent at a predetermined ratio. For example, the AX and $BX_2$ may be dissolved in the polar solvent at a ratio of 2:1 to prepare the first solution in which the $A_2BX_4$ hybrid perovskite is dissolved.

Also, it is preferable that the hybrid perovskite uses a material having a 2D crystal structure rather than a 2D crystal structure.

When the hybrid perovskite having the 2D structure is formed to have the nanocrystal in comparison that the hybrid perovskite having the 3D structure is formed to have the nanocrystal, the inorganic plane and the organic plane, which are stacked on each other, may be clearly distinguished from each other to more firmly confine the exciton in the inorganic plane with respect to the organic plane and thereby to improve luminescent efficiency and durability (or stability), thereby implementing higher color purity.

Also, the non-polar solvent may include dichloroethylene, trichlorethylene, chloroform, chlorobenzene, dichlorobenzene, styrene, xylene, toluene, or cyclohexene, but is not limited thereto.

Also, the alkyl halide surfactant may have a structure of alkyl-X. Here, the halogen element corresponding to the X may include Cl, Br, or I. Also, the alkyl structure may include acyclic alkyl having a structure of CnH2n+1, primary alcohol having a structure such as $C_nH_{2n+1}OH$, secondary alcohol, tertiary alcohol, alkylamine having a structure of alkyl-N (e.g.' hexadecyl amine, 9-Octadecenylamine 1-Amino-9-octadecene $(C_{19}H_{37}N)$), p-substituted aniline, phenyl ammonium, or fluorine ammonium, but is not limited thereto.

A carboxylic acid (COOH) and amines (NH3) surfactant may be used instead of the alkyl halide surfactant.

For example, the surfactant may include a carboxylic acid such as a 4,4'-Azobis(4-cyanovaleric acid), an acetic acid, a 5-aminosalicylic acid, an acrylic acid, an L-aspentic acid, a 6-bromohexanoic acid, a bromoacetic acid, a dichloro acetic acid, an ethylenediaminetetraacetic acid, an isobutyric acid, an itaconic acid, a maleic acid, an r-maleimidobutyric acid, an L-malic acid, a 4-Nitrobenzoic acid, an amino acid, a 1-pyrenecarboxylic acid, or an oleic acid, but is not limited thereto.

Next, the first solution may be mixed with the second solution to form the particle. (S200).

In the step of mixing the first solution with the with the second solution to form the particle, it is preferable to mix the first solution by dropping into the second solution in drops. Also, the second solution may be stirred. For example, the second solution in which the hybrid perovskite is dissolved may be slowly added dropwise into the second solution in which the alkyl halide surfactant that is being strongly stirred is dissolved to synthesize the particle.

In this case, when the first solution drops to be mixed with the second solution, the hybrid perovskite (shortly "perovskite") is precipitated from the second solution due to a difference in solubility. Also, a surface of the hybrid perovskite precipitated from the second solution is surrounded by the alkyl halide surfactant and thus stabilized to generate a halide perovskite nanocrystal (perovskite-NC) that is well dispersed. Thus, the hybrid perovskite particle light-emitter including the halide perovskite nanocrystal structure and the plurality of alkyl halide organic ligands or inorganic binary compounds or combination thereof surrounding the halide perovskite nanocrystal structure may be manufactured.

The hybrid perovskite particle may have a size that is controllable by adjusting a length or a shape factor of the alkyl halide surfactant. For example, the adjustment of the shape factor may be controlled through the surfactant having a linear, tapered, or inverted triangular shape.

It is preferable that the generated hybrid perovskite particle has a size of 1 nm to 900 nm. Here, the size of the particle represents a size without considering a size of the ligand that will be described later, i.e., a size of a remaining portion except for the ligand.

If the hybrid perovskite particle has a size exceeding 900 nm, it is a fundamental problem in which the large non-radiative decay of the excitons can occur at room temperature by thermal ionization and the delocalization of the charge carrier, and a large number of excitons are separated as free charge carriers and then annihilated.

Figure 4:
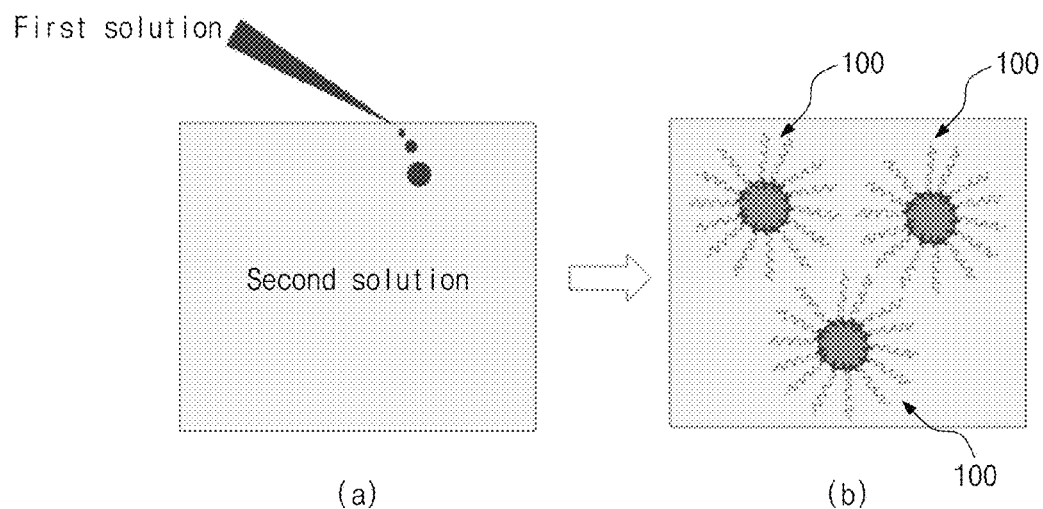
FIG. 4 is a schematic view illustrating a method for method for manufacturing the hybrid perovskite particle light-emitter according to an embodiment of the present invention.

FIG. 4 is a schematic view illustrating a method for manufacturing the hybrid perovskite particle light-emitter having the 2D structure according to an embodiment of the present invention.

Referring to FIG. 4 (a), the first solution in which the hybrid perovskite is dissolved in the polar solvent is added dropwise into the second solution in which the alkyl halide surfactant is dissolved in the non-polar solvent.

Referring to FIG. 4 (b), when the first solution is added to the second solution, the hybrid perovskite is precipitated from the second solution due to a difference in solubility. A surface of the precipitated hybrid perovskite is surrounded by the alkyl halide surfactant and thus stabilized to generate a hybrid perovskite particle light-emitter 100 that is well dispersed. Here, the surface of the halide perovskite nanocrystal structure is surrounded by the organic ligands that include alkyl halide, inorganic binary compounds or combination thereof.

Thereafter, the polar solvent including the hybrid perovskite particle that is dispersed in the non-polar solvent, in which the alkyl halide surfactant is dissolved, may be heated and thus selectively evaporated, or a co-solvent, in which all the polar and non-polar solvents are capable of being dissolved, may be added to selectively extract the polar solvent including the particle from the non-polar solvent, thereby obtaining the hybrid perovskite particle light-emitter.

The hybrid perovskite particle light-emitter having the 2D structure according to an embodiment of the present invention will be described.

The hybrid perovskite particle light-emitter according to an embodiment of the present invention may include a halide perovskite nanocrystal structure that has the 2D structure and is dispersible in an organic solvent. Here, the organic solvent may be the polar solvent or the non-polar solvent. For example, the polar solvent may include dimethylformamide, gamma butyrolactone, N-methylpyrrolidone, dimethylsulfoxide or isopropyl alcohol, and the non-polar solvent may include dichloroethylene, trichlorethylene, chloroform, chlorobenzene, dichlorobenzene, styrene, dimethylformamide, dimethylsulfoxide, xylene, toluene, cyclohexene.

Also, the particle may have a spherical, cylindrical, cylindroid, polyprism or two-dimensional (lamellar, plate) shape.

Also, the particle may have a size of 1 nm to 900 nm. Here, the size of the particle represents a size without considering a size of the ligand that will be described later, i.e., a size of a remaining portion except for the ligand. For example, when the particle has the spherical shape, the particle may have a diameter of 1 nm to 900 nm.

Also, the particle may have bandgap energy of 1 eV to 5 eV. Thus, since the energy bandgap is determined according to the composition and the crystal structure of the particle, the composition of the particle may be adjusted to emit light having a wavelength of, for example, 200 nm to 1300 nm.

Also, the plurality of organic ligands surrounding the halide perovskite nanocrystal structure may be further provided.

Hereinafter, embodiments of the present invention will be described with reference to FIG. 5.

Figure 5:
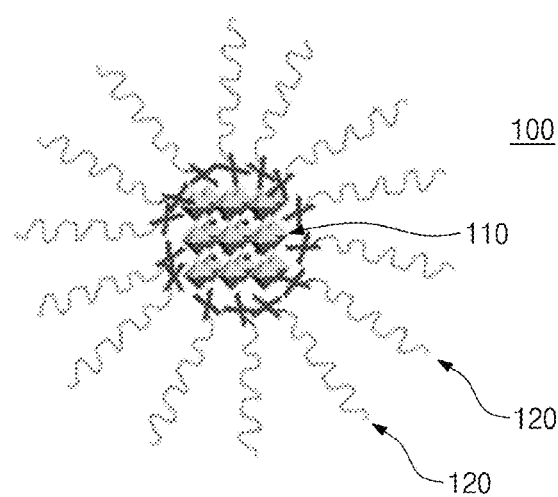
FIG. 5 is a schematic view of a hybrid perovskite particle light-emitter and an inorganic metal halide perovskite particle light-emitter according to an embodiment of the present invention.

FIG. 5 is a schematic view of a hybrid perovskite particle light-emitter and an inorganic metal halide perovskite particle light-emitter according to an embodiment of the present invention.

Here, FIG. 5 illustrates the hybrid perovskite particle light-emitter. If the hybrid perovskite of FIG. 5 is changed into the inorganic metal halide perovskite, since the inorganic metal halide perovskite particle light-emitter is provided, their descriptions are the same.

Referring to FIG. 5, the light-emitter according to an embodiment of the present invention may be the hybrid perovskite particle light-emitter or the inorganic metal halide perovskite particle light-emitter and includes a halide perovskite nanocrystal structure or inorganic metal halide perovskite nanocrystal structure 110 that is dispersible in the organic solvent.

Also, the hybrid perovskite having the 2D crystal structure may be a structure of $A2BX_4 \cdot ABX_4$, or $An_{-1}PbnX3n+1$ (where, n is an integer between 2 to 6).

Here, the A is an organic ammonium or inorganic inorganic alkali metal material, the B is a metal material, and the X is a halogen element. For example, the A may be (CH3NH3)nr ((CxH2x+1)nNH2) (CH2NH3)nr R(NH2)2r (CnH2n+1NH3), CF3NH3, $(CF_3NH_3)_n$, $((C_xF_{2x-1})_nNH_2)$ $(CF_2NH_3)_n$, $((C_xF_{2x+1})_nNH_3)$, $(C_nF_{2n+1}NH_3)$, $(CH(NF_2)_2)$, CxH2x+1 ($C(NH_2)_2$), metal, Cs, Rb, K, or derivative thereof (R is alkyl or fluoroalkyl, where n is an integer equal to or greater than 1, and x is an integer equal to or greater than 1). Here, the B may be a divalent transition metal, a rare earth metal, an alkali earth metal, Pb, Sn, Ge, Ga, In, Al, Sb, Bi, Po, or a combination thereof. Here, the rare earth metal may be, for example, Ge, Sn, Pb, Eu, or Yb. Also, the alkali earth metal may be, for example, Ca or Sr. Also, the X may be Cl, Br, I, or a combination thereof.

The hybrid perovskite particle light-emitter 100 having the 2D structure according to the present invention may further include a plurality of organic ligands 120 or combination thereof surrounding the above-described hybrid or metal halide perovskite nanocrystal structure 110. Each of the organic ligands 120 may include alkyl halide.

Also, the alkyl halide surfactant may have a structure of alkyl-X. Here, the halogen element corresponding to the X may include Cl, Br, or I. Also, the alkyl structure may include acyclic alkyl having a structure of CnH$_2$ n+1r primary alcohol having a structure such as C$_n$H$_{2n+1}$OH, secondary alcohol, tertiary alcohol, alkylamine having a structure of alkyl-N (e.g.' hexadecyl amine, 9-Octadecenylamine 1-Amino-9-octadecene p-substituted aniline, phenyl ammonium, or fluorine ammonium, but is not limited thereto.

Also, the inorganic metal halide perovskite having the 2D crystal structure may be a structure of A$_2$BX$_4$, ABX$_4$, or An−1PbnX$_3$n+1 (where, n is an integer between 2 to 6).

The A may be an alkali metal, the B may be a divalent divalent transition metal, a rare earth metal, an alkali earth metal, Pb, Sn, Ge, Ga, In, Al, Sb, Bi, Po, or a combination thereof, and the X may be Cl, Br, I, or a combination thereof. Here, the rare earth metal may be, for example, Ge, Sn, Pb, Eu, or Yb. Also, the alkali earth metal may be, for example, Ca or Sr.

The inorganic metal halide perovskite particle light-emitter having the 2D structure according to the present invention may further include a plurality of organic ligands surrounding the above-described inorganic metal halide perovskite nanocrystal structure. Each of the organic ligands may include alkyl halide.

Referring again to FIG. 2, a first organic ligand of the hybrid perovskite particle light-emitter is substituted with a second organic ligand in the solution (S200).

Here, the second organic ligand having a length less than that of the first organic ligand or including a phenyl group or a fluorine group may be added to the solution to substitute the first organic ligand with the second organic ligand. Here, heat may be applied to perform substitution reaction.

Each of the second organic ligands may include alkyl include alkyl halide. Also, the second organic ligand may have a structure of alkyl-X'. Here, the halogen element corresponding to the X' may include Cl, Br, or I. Also, the alkyl structure may include acyclic alkyl having a structure of CnH$_2$ n+1r primary alcohol having a structure such as CnH$_2$ n+1OH, secondary alcohol, tertiary alcohol, alkylamine having a structure of alkyl-N (e.g.' hexadecyl amine, 9-Octadecenylamine 1-Amino-9-octadecene (C$_{19}$H$_{37}$N)), p-substituted aniline, phenyl ammonium, or fluorine ammonium, but is not limited thereto.

Also, the second organic ligand may include alkyl halide, and the halogen element of the second organic ligand may be an element having a higher affinity for a center metal of the halide perovskite nanocrystal structure than that of the halogen element of the first organic ligand.

For example, when the first organic ligand is CH$_3$ (CH$_2$)$_{17}$NH$_3$Br, CH$_3$ (CH$_2$)$_8$NH$_3$I as an alkali halide surfactant having a short length and including the halogen element that has a higher affinity for a center metal of the halide perovskite nanocrystal structure than that of the halogen element of the first organic ligand may be added and then heated to perform the organic ligand substitution. Thus, CH$_3$ (CH$_2$)$_8$NH$_3$I may become the second organic ligand surrounding the nanocrystal structure, and thus, the organic ligand of the particle light-emitter may be reduced in length.

As described above, in the hybrid perovskite particle light-emitter according to the present invention, the alkyl halide (the first organic ligand) used as the surfactant for stabilizing the surface of the precipitated hybrid perovskite may surround the surface of the hybrid perovskite to form the nanocrystal structure.

If the alkyl halide surfactant has a short length, length, the formed particle may increase in size to exceed 900 nm. In this case, the light emission of the exciton may not occur by thermal ionization and the delocalization of the charge carriers in the large particle, and the exciton may be separated as the free charge carriers and then annihilated.

That is, the size of the formed hybrid perovskite particle is inversely proportional to the length of the alkyl halide surfactant used for forming the particle.

Thus, the size of the hybrid perovskite particle formed by using the alkyl halide having a predetermined length or more as the surfactant may be controlled to a predetermined size or less. For example, octadecyl-ammonium bromide may be used as the alkyl halide surfactant to form the hybrid perovskite particle having a size of a 900 nm or less.

Thus, the alkyl halide (the first organic ligand) having a predetermined length or more may be used to form the particle having a predetermined size or more, and then, the first organic ligand may be substituted with the ligand having the short length or including the phenyl group or the fluorine group to more increase the energy transfer or the charge injection in the nanocrystal structure, thereby more improving the luminescent efficiency. Furthermore, durability (or stability) may also be improved by the substituted hydrophobic ligand.

The substitution step (S200) will be described in more detail with reference to FIG. 6.

Figure 6:
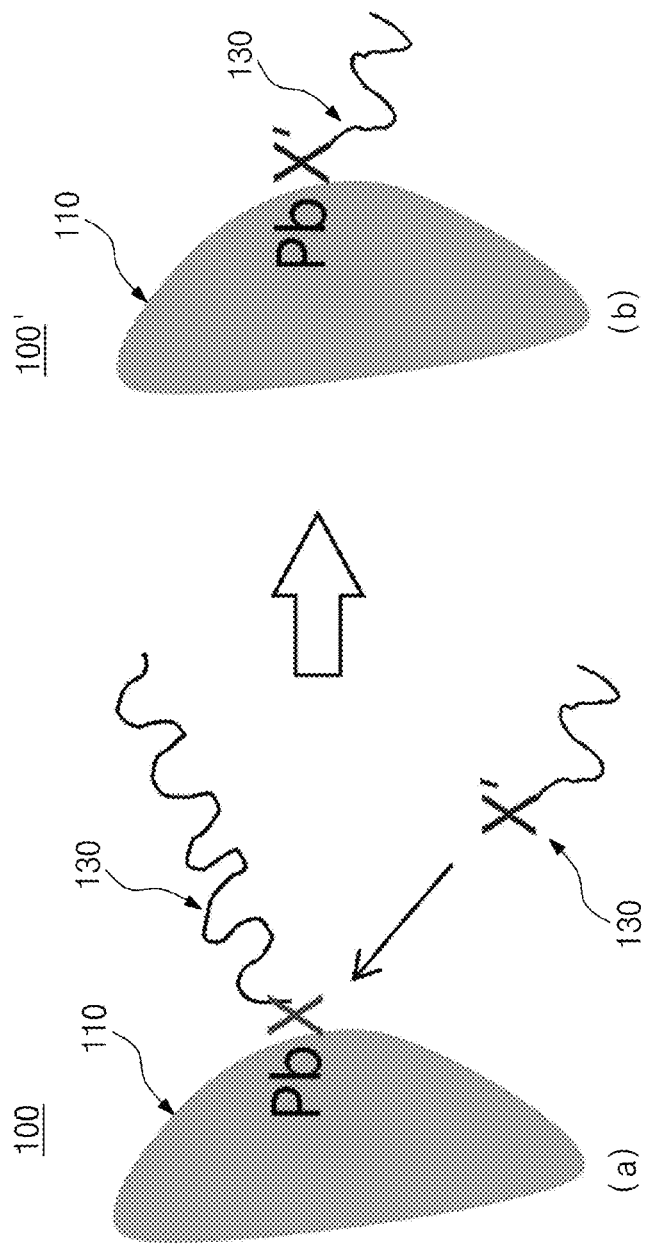
FIG. 6 is a schematic view illustrating a method for manufacturing the hybrid perovskite particle light-emitter, in which the organic ligand is substituted, according to an embodiment of the present invention.

FIG. 6 is a schematic view illustrating a method for manufacturing the hybrid perovskite particle light-emitter, in which the organic ligand is substituted, according to an embodiment of the present invention.

Referring to FIG. 6(a), the hybrid perovskite particle light-emitter 100 including the halide perovskite nanocrystal structure 110 and the first organic ligand 120 surrounding the nanocrystal structure 110 is prepared. The particle light-emitter 100 may be prepared in state (a liquid state) that is contained in a solution. As illustrated in the drawings, Pb may be described as an example of the center metal of the halide perovskite nanocrystal structure 110.

Next, the second organic ligand 130 is added to the solution containing the particle light-emitter 100.

Referring to FIG. 6(b), since the second organic ligand 130 is added, the first organic ligand 120 is substituted with the second organic ligand 130. The organic ligand substitution may be performed by using an intensity difference in affinity between the center metal of the halide perovskite nanocrystal structure 110 and the halogen element. For example, the affinity with the center metal may increase in order of Cl<Br<I.

Thus, when the halogen element X of the first organic ligand 120 is Cl, the ligand substitution may be performed by using Br or I as the halogen element X' of the second organic ligand 130.

Thus, the first organic ligand 120 may be substituted with the second organic ligand 130 having the short length and including the fluorine group to form a hybrid perovskite particle light-emitter 100' which has improved luminescent efficiency and in which the organic ligand is substituted.

A method for manufacturing the inorganic metal halide metal halide perovskite particle light-emitter, in which the organic ligand is substituted, according to an embodiment of the present invention will be described.

The method for manufacturing the inorganic metal halide perovskite particle light-emitter, in which the organic ligand is substituted may include a step of preparing a solution including an inorganic metal halide perovskite particle light-emitter including an inorganic metal halide perovskite nanocrystal structure and a plurality of first organic ligands surrounding a surface of the inorganic metal halide perovskite nanocrystal structure and a step of adding a second organic ligand having a short length or including a phenyl group or a fluorine group to substitute the first organic ligand with the second organic ligand.

Each of the first organic ligand and the second organic ligand may include alkyl halide, and the halogen element of the second organic ligand may be an element having affinity equal to or higher than that of the halogen element of the first organic ligand with respect to a center metal of the halide perovskite nanocrystal structure.

The inorganic metal halide perovskite material may include a structure of $ABX_3$, $A_2BX_4$, $ABX_4$, or $An-1PbnX_3n+1$ (n is an integer between 2 to 6), where the A may be an alkali metal, the B may be a metal material, and the X may be a halogen element.

Here, the A may be Na, K, Rb, Cs, or Fr, the B may be a divalent transition metal, a rare earth metal, an alkali earth metal, Pb, Sn, Ge, Ga, In, Al, Sb, Bi, Po, or a combination thereof, and the X may be Cl, Br, I, or a combination thereof.

Here, the substitution methods may be the same except same except that, in the "inorganic metal halide" perovskite particle, an A site material is an alkali metal, and in the "hybrid" perovskite particle, an A site material is an organic ammonium material. Thus, the method for substituting the organic ligand of the inorganic metal halide perovskite particle is the same as that for manufacturing the hybrid perovskite particle light-emitter in which the organic ligand is substituted, and thus, its detailed description will be omitted.

A light emitting device according to an embodiment of the present invention will be described.

A light emitting device according to an embodiment of the present invention may be a device using a light emitting layer including an halide perovskite nanocrystal light-emitter in which an organic ligand is substituted or an inorganic metal halide perovskite particle light-emitter in which an organic ligand is substituted. Here, the halide perovskite nanocrystal light-emitter in which the organic ligand is substituted or the inorganic metal halide perovskite particle light-emitter in which the organic ligand is substituted may be manufactured through the above-described manufacturing methods.

For example, the light emitting device according to the present invention may include a first electrode, a second electrode, and a light emitting layer disposed between the first electrode and the second electrode and including the halide perovskite nanocrystal light-emitter in which the organic ligand is substituted or the inorganic metal halide perovskite particle light-emitter in which the organic ligand is substituted.

For another example, the hybrid perovskite particle in which the organic ligand is substituted or the inorganic metal halide perovskite particle in which the organic ligand is substituted may be applied to a solar cell by using a photoactive layer including the above-described hybrid perovskite particle and the inorganic metal halide perovskite particle. The solar cell may include a first electrode, a second electrode, and a photoactive layer disposed between the first electrode and the second electrode and including the above-described perovskite particle.

MANUFACTURING EXAMPLE 1

A hybrid perodvskite nanocrystal colloidal particle light-emitter having a 3D structure according to an embodiment of the present invention was formed. The inorganic metal halide perovskite nanocrystal colloidal particle light-emitter was formed through an inverse nano-emulsion method, or reprecipitation method, or hot injection method.

Particularly, hybrid perovskite was dissolved in a polar solvent to prepare a first solution. Here, dimethylformamide was used as the polar solvent, and $CH_3NH_3PbBr_3$ was used as the hybrid perovskite. Here, the used $CH_3NH_3PbBr_3$ was prepared by mixing $CH_3NH_3Br$ with $PbBr_2$ at a ratio of 1:1.

Also, a second solution in which an alkyl halide surfactant is dissolved in a non-polar solvent was prepared. Here, toluene was used as the non-polar solvent, and octadecylammonium bromide alkyl ($C_3(C_2)_{17}NH_3Br$) was used as the halide surfactant.

Then, the first solution slowly dropped drop wise into the second solution that is being strongly stirred to form the hybrid perovskite nanocrystal colloidal particle light-emitter having the 3D structure.

Then, the hybrid perovskite colloidal particle that is in a liquid state was spin-coated on a glass substrate to form a hybrid perovskite particle thin film (perovskite-NP film)

Here, the formed hybrid perovskite particle has a size of about 20 nm.

MANUFACTURING EXAMPLE 2

The same process as that according to Manufacturing Example 1 was performed, and $CH_3(CH_2)_{13}NH_3Br$ was used as an alkyl halide surfactant to form a hybrid perovskite nanocrystal colloidal particle light-emitter having a 3D structure according to an embodiment of the present invention.

Here, the formed hybrid perovskite particle has a size of about 100 nm.

MANUFACTURING EXAMPLE 3

The same process as that according to Manufacturing Example 1 was performed, and $CH_3(CH_2)_{10}NH_3Br$ was used as an alkyl halide surfactant to form a hybrid perovskite particle light-emitter having a 3D structure according to an embodiment of the present invention.

Here, the formed hybrid perovskite particle has a size of about 300 nm.

MANUFACTURING EXAMPLE 4

The same process as that according to Manufacturing Example 1 was performed, and $CH_3(CH_2)_7NH_3Br$ was used as an alkyl halide surfactant to form a hybrid perovskite particle light-emitter having a 3D structure according to an embodiment of the present invention.

Here, the formed hybrid perovskite particle has a size of about 500 nm.

MANUFACTURING EXAMPLE 5

The same process as that according to Manufacturing Example 1 was performed, and $CH_3(CH_2)_4NH_3Br$ was used as an alkyl halide surfactant to form a hybrid perovskite particle light-emitter having a 3D structure according to an embodiment of the present invention.

Here, the formed hybrid perovskite particle has a size of about 700 nm.

MANUFACTURING EXAMPLE 6

The same process as that according to Manufacturing Example 1 was performed, and $CH_3CH_2NH_3Br$ was used as an alkyl halide surfactant to form a hybrid perovskite particle light-emitter having a 3D structure according to an embodiment of the present invention.

Here, the formed hybrid perovskite particle has a size of about 800 nm.

MANUFACTURING EXAMPLE 7

The same process as that according to Manufacturing Example 1 was performed, and $CH_3NH_3Br$ was used as an alkyl halide surfactant to form a hybrid perovskite particle light-emitter having a 3D structure according to an embodiment of the present invention.

Here, the formed hybrid perovskite particle has a size of about 900 nm.

MANUFACTURING EXAMPLE 8

A hybrid perovskite particle light-emitter having a 3D structure according to an embodiment of the present invention was formed. The inorganic metal halide perovskite particle light-emitter was formed through an inverse nano-emulsion method, or reprecipitation method, or hot injection method.

Particularly, hybrid perovskite was dissolved in a polar solvent to prepare a first solution. Here, dimethylformamide was used as the polar solvent, and $(CH_3NH_3)_2PbBr_3$ was used as the hybrid perovskite. Here, the used $CH_3NH_3PbBr_3$ was prepared by mixing $CH_3NH_3Br$ with $PbBr_2$ at a ratio of 1:1.

Also, a second solution in which an alkyl halide surfactant is dissolved in a non-polar solvent was prepared. Here, toluene was used as the non-polar solvent, and octadecylammonium bromide $(CH_3(CH_2)_{17}NH_3Br)$ was used as the alkyl halide surfactant.

Then, the first solution slowly dropped drop wise into the second solution that is being strongly stirred to form a hybrid perovskite particle light-emitter having a 2D structure. Here, the formed hybrid perovskite particle has a size of about 20 nm.

Then, $CH_3(CH_2)_8NH_3I$ as an alkyl halide surfactant may surfactant may be added to the second solution and heated to perform the organic ligand substitution. Thus, $CH_3(CH_2)_8NH_3I$ may become the second organic ligand surrounding the nanocrystal structure. Thus, the hybrid perovskite particle light-emitter, in which the organic ligand is substituted, including the halide perovskite nanocrystal structure having a size of about 20 nm and the $CH_3(CH_2)_8NH_3I$ organic ligand surrounding the nanocrystal structure was manufactured.

MANUFACTURING EXAMPLE 9

The same process as that according to Manufacturing Example 1 was performed, and $(CH_3NH_3)_2PbCl_4$ was used as the hybrid perovskite. Here, the used $(CH_3NH_3)_2PbCl_4$ was prepared by mixing $CH_3NH_3Cl$ with $PbCl_2$ at a ratio of 2:1.

Here, the formed hybrid perovskite nanocrystalline particle emits light near to ultraviolet or blue color. The light emission spectrum is located at about 380 nm.

MANUFACTURING EXAMPLE 10

The same process as that according to Manufacturing Example 1 was performed, and $(CH_3NH_3)_2PbI_4$ was used as the hybrid perovskite. Here, the used $(CH_3NH_3)_2PbI_4$ was prepared by mixing $CH_3NH_3I$ with $PbI_2$ at a ratio of 2:1.

Here, the formed hybrid perovskite nanocrystalline particle emits light near to infrared or red color. The light emission spectrum is located at about 780 nm.

MANUFACTURING EXAMPLE 11

The same process as that according to Manufacturing Example 1 was performed, and $(CH_3NH_3)_2PbCl_xBr_{4-x}$ was used as the hybrid perovskite. Here, the used $(CH_3NH_3)_2PbCl_xBr_4$, was prepared by mixing $CH_3NH_3Cl$ with $PbBr_2$ at a ratio of 2:1.

Here, the light emission spectrum of the formed hybrid perovskite nanocrystalline particle is located between 380 nm and 520 nm.

MANUFACTURING EXAMPLE 12

The same process as that according to Manufacturing Example 1 was performed, and $(CH_3NH_3)_2PbI_xBr_{4-x}$ was used as the hybrid perovskite. Here, the used $(CH_3NH_3)_2PbI_xBr_{4-x}$ was prepared by mixing $CH_3NH_3I$ with $PbBr_2$ at a predetermined ratio.

Here, the light emission spectrum of the formed hybrid perovskite nanocrystalline particle is located between 520 nm and 780 nm.

MANUFACTURING EXAMPLE 13

The same process as that according to Manufacturing Example 1 was performed, and $(CH(NH2)_2)_2PbI_4$ was used as the hybrid perovskite. Here, the used $(CH(NH_2)_2)_2PbI_4$ was prepared by mixing $CH(NH)_2I$ with $PbI_2$ at a ratio of 2:1.

Here, the light emission spectrum of the formed hybrid perovskite nanocrystalline particle emits infrared light and is located at about 800 nm.

MANUFACTURING EXAMPLE 14

The same process as that according to Manufacturing Manufacturing Example 1 was performed, and $(CH_3NH_3)_2Pb_xSn_{1-x}I_4$ was used as the hybrid perovskite. Here, the used $(CH_3NH_3)_2Pb_xSn_{1-x}I_4$ was prepared by mixing $CH_3NH_3I$ with $Pb_xSn_{1-x}I_2$ at a ratio of 2:1.

Here, the light emission spectrum of the formed hybrid perovskite nanocrystalline particle is located between 820 nm and 1120 nm.

MANUFACTURING EXAMPLE 15

The same process as that according to Manufacturing Example 1 was performed, and $(CH_3NH_3)_2Pb_xSn_{1-x}Br_4$ was used as the hybrid perovskite. Here, the used $(CH_3NH_3)_2Pb_xSn_{1-x}Br_4$ was prepared by mixing $CH_3NH_3Br$ with $Pb_xSn_{1-x}Br_2$ at a ratio of 2:1.

Here, the light emission spectrum of the formed hybrid perovskite nanocrystalline particle is located between 540 nm and 650 nm.

MANUFACTURING EXAMPLE 16

The same process as that according to Manufacturing Example 1 was performed, and $(CH_3NH_3)_2Pb_xSn_{1-x}Cl_4$ was used as the hybrid perovskite. Here, the used $(CH_3NH_3)_2Pb_xSn_{1-x}Cl_4$ was prepared by mixing $CH_3NH_3Cl$ with $Pb_xSn_{1-x}Cl_2$ at a ratio of 2:1.

Here, the light emission spectrum of the formed hybrid perovskite nanocrystalline particle is located between 400 nm and 460 nm.

MANUFACTURING EXAMPLE 17

The same process as that according to Manufacturing Example 1 was performed, and $(C_4H_9NH_3)PbBr_4$ was used as the hybrid perovskite. Here, the used $(C_4H_9NH_3)PbBr_4$ was prepared by mixing $(C_4H_9NH_3)Br$ with $PbBr_2$ at a ratio of 2:1.

Here, the light emission spectrum of the formed hybrid perovskite nanocrystalline particle is located at about 411 nm.

MANUFACTURING EXAMPLE 18

The same process as that according to Manufacturing Example 1 was performed, and $(C_5H_{11}NH_3)PbBr_4$ was used as the hybrid perovskite. Here, the used $(C_5H_{11}NH_3)PbBr_4$ was prepared by mixing $(C_5H_{11}NH_3)Br$ with $PbBr_2$ at a ratio of 2:1.

Here, the light emission spectrum of the formed hybrid perovskite nanocrystalline particle is located at about 405 nm.

MANUFACTURING EXAMPLE 19

The same process as that according to Manufacturing Example 1 was performed, and $(C_7H_{15}NH_3)PbBr_4$ was used as the hybrid perovskite. Here, the used $(C_7H_{15}NH_3)PbBr_4$ was prepared by mixing $(C_7H_{15}NH_3)Br$ with $PbBr_2$ at a ratio of 2:1.

Here, the light emission spectrum of the formed hybrid perovskite nanocrystalline particle is located at about 401 nm.

MANUFACTURING EXAMPLE 20

The same process as that according to Manufacturing Example 1 was performed, and $(C_{12}H_{25}NH_3)PbBr_4$ was used as the hybrid perovskite. Here, the used $(C_{12}H_{25}NH_3)PbBr_4$ was prepared by mixing $(C_{12}H_{25}NH_3)Br$ with $PbBr_2$ at a ratio of 2:1.

Here, the light emission spectrum of the formed hybrid perovskite nanocrystalline particle is located at about 388 nm.

MANUFACTURING EXAMPLE 21

The inorganic metal halide perovskite particle light-emitter according to an embodiment of the present invention was formed. The inorganic metal halide perovskite particle light-emitter was formed through an inverse nano-emulsion method, or reprecipitation method, or hot injection method.

Particularly, $Cs_2CO_3$ and an oleic acid were added to octadecene (ODE) that is a non-polar solvent to react at a high temperature, thereby preparing a third solution. $PbBr_2$, the oleic acid, and oleylamine were added to the non-polar solvent to react for one hour at a high temperature (120° C.), thereby preparing a fourth solution.

Then, the third solution slowly dropped drop wise into the fourth solution that is being strongly stirred to form the inorganic metal halide perovskite ($CsPbBr_3$) particle light-emitter having the 3D structure.

Then, the inorganic metal halide perovskite particle that is dispersed in the solution was spin-coated on a glass substrate to form an inorganic halide perovskite particle thin film (perovskite-NP film).

Here, the formed inorganic metal halide perovskite particle has a size of about 20 nm.

MANUFACTURING EXAMPLE 22

The organic ligand of the inorganic metal halide halide perovskite particle according to Manufacturing Example 21 was substituted.

First, the fourth solution in which the inorganic metal halide perovskite particle according to Manufacturing Example 21 is dispersed was prepared.

Then, $CH_3(CH_2)_8NH_3I$ as an alkyl halide surfactant may be added to the fourth solution and heated to perform the organic ligand substitution. Thus, $CH_3(CH_2)_8NH_3I$ may become the second organic ligand surrounding the nanocrystal structure. Thus, the inorganic metal halide perovskite particle light-emitter, in which the organic ligand is substituted, including the inorganic metal halide perovskite nanocrystal structure having a size of about 20 nm and the $CH_3(CH_2)_8NH_3I$ organic ligand surrounding the nanocrystal structure was manufactured.

MANUFACTURING EXAMPLE 23

A light emitting device according to an embodiment of the present invention was manufactured.

First, after an ITO substrate (a glass substrate coated with an ITO anode) is performed, PEDOT: PSS (AI4083 from Heraeus company) that is a conductive material was spin-coated on the ITO anode and then thermally treated for 30 minutes at a temperature of 150° C. to form a hole injection layer having a thickness of 40 nm.

The solution in which the hybrid perovskite particle light-emitter, in which the organic ligand is substituted, according to Manufacturing Example 8 is dispersed was spin-coated on the hole injection layer and then thermally treated for 20 minutes at a temperature of 80° C. to form an hybrid perovskite particle light emitting layer.

Thereafter, 1,3,5-Tris(1-phenyl-1H-benzimidazol-2-yl) benzene (TPBI) having a thickness of 50 nm was deposited on the hybrid perovskite particle light emitting layer under a high vacuum state of $1\times10^{-7}$ Torr or more to form an electron transport layer, and then, LiF having a thickness of 1 nm was deposited on the electron transport layer to form an electron injection layer. Then, aluminum having a thickness of 100 nm was deposited on the electron injection layer to form a cathode, thereby manufacturing a hybrid perovskite particle light emitting device.

MANUFACTURING EXAMPLE 24

A solar cell according to an embodiment of the present invention was manufactured.

First, after an ITO substrate (a glass substrate coated with an ITO anode) is performed, PEDOT: PSS (AI4083 from CLEVIOS PH company) that is a conductive material was spin-coated on the ITO anode and then thermally treated for 30 minutes at a temperature of 150° C. to form a hole extraction layer having a thickness of 40 nm.

The hybrid perovskite particle, in which the organic ligand is substituted, according to Manufacturing Example 1 was mixed with Phenyl-C61-butyric acid methyl ester (PCBM) and then applied to the hole extraction layer to form a photoactive layer, and Al having a thickness of 100 nm was deposited on the photoactive layer to manufacture a perovskite particle solar cell.

COMPARATIVE EXAMPLE 1

$CH_3NH_3PbBr_3$ was dissolved in dimethylformamide that is a polar solvent to manufacture a first solution.

Then, the first solution was spin-coated on a glass substrate to manufacture a $CH_3NH_3PbBr_3$ thin film (perovskite film).

COMPARATIVE EXAMPLE 2

$CH_3NH_3PbCl_3$ was dissolved in dimethylformamide that is a polar solvent to manufacture a first solution.

Then, the first solution was spin-coated on a glass substrate to manufacture a $CH_3NH_3PbCl_3$ thin film (perovskite film).

EXPERIMENTAL EXAMPLE

Figure 7:
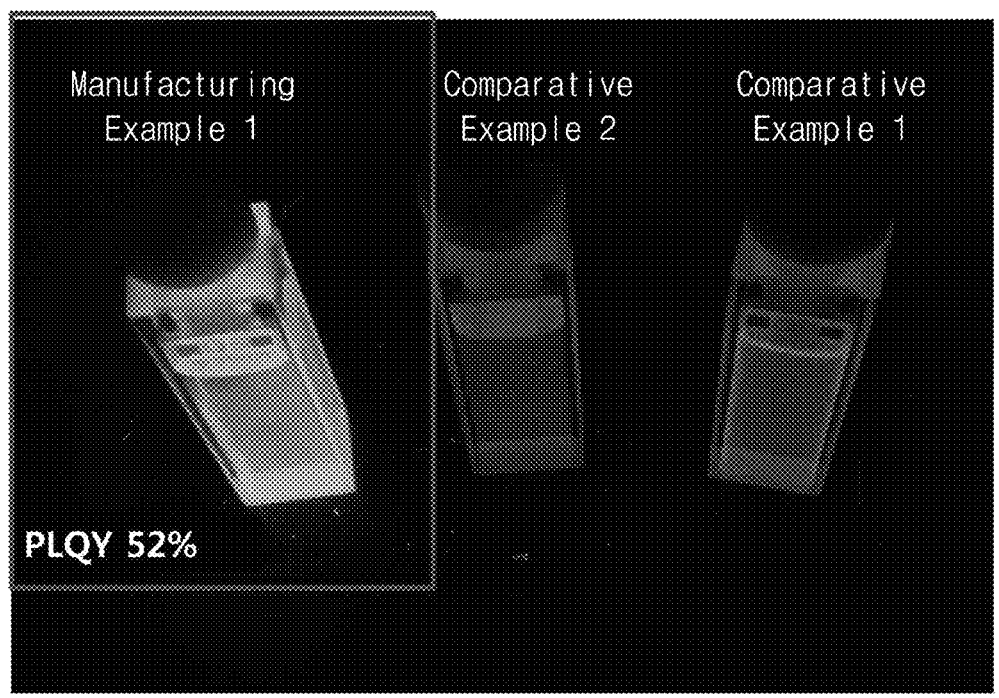
FIG. 7 is a fluorescent image obtained by photographing emission light by irradiating ultraviolet rays onto a light-emitter according to Manufacturing Example 1, Comparative Example 1, and Comparative Example 2.

FIG. 7 is a fluorescent image obtained by photographing emission light by irradiating ultraviolet rays onto a light-emitter according to Manufacturing Example 1, Comparative Example 1, and Comparative Example 2.

Referring to FIG. 7, it is seen that a hybrid perovskite solution, which is not in the form of a nanocrystal, but in the form of a bulk, according to Comparative Example 1 and Comparative Example 2 emits dark light, but the luminescent material having the nanocrystal according to Manufacturing Example 1 emits very bright green light.

Also, as a result of measuring the photoluminescence photoluminescence quantum yield (PLQY), it is seen that the hybrid perovskite particle light-emitter according to Manufacturing Example 1 has a very high value of 52%.

On the other hand, in Comparative Example 1 and Comparative Example 2, the hybrid perovskite having the form of the thin film, which is manufactured by spin-coating on the glass substrate, had a PLQY value of about 1%.

Figure 8:
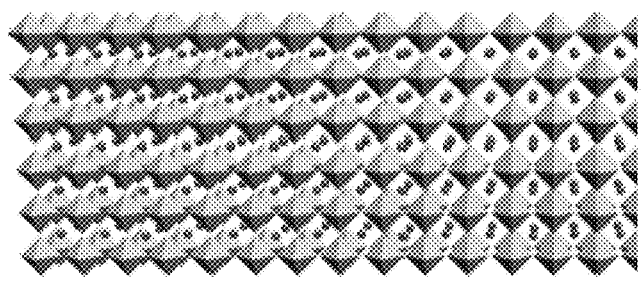
FIG. 8 is a schematic view of a light-emitter according to Manufacturing Example 1 and Comparative Example 1.
Figure 8:
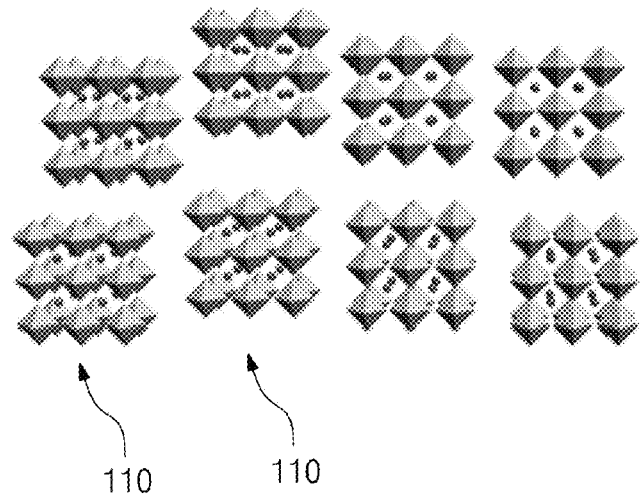

FIG. 8 is a schematic view of a light-emitter according to Manufacturing Example 1 and Comparative Example 1.

FIG. 8(a) is a schematic view of a light-emitter thin film (perovskite film) according to Comparative Example 1, FIG. 8 (b) is a schematic view of a light-emitter thin film (perovskite-NP film) according to Manufacturing Example 1. Referring to FIG. 8(a), the particle according to Comparative Example 1 has the form of the thin film manufactured by spin-coating the first solution on the glass substrate. Referring to FIG. 8 (b), the light-emitter according to Manufacturing Example 1 has the form of the nanocrystal structure 110.

Figure 9:
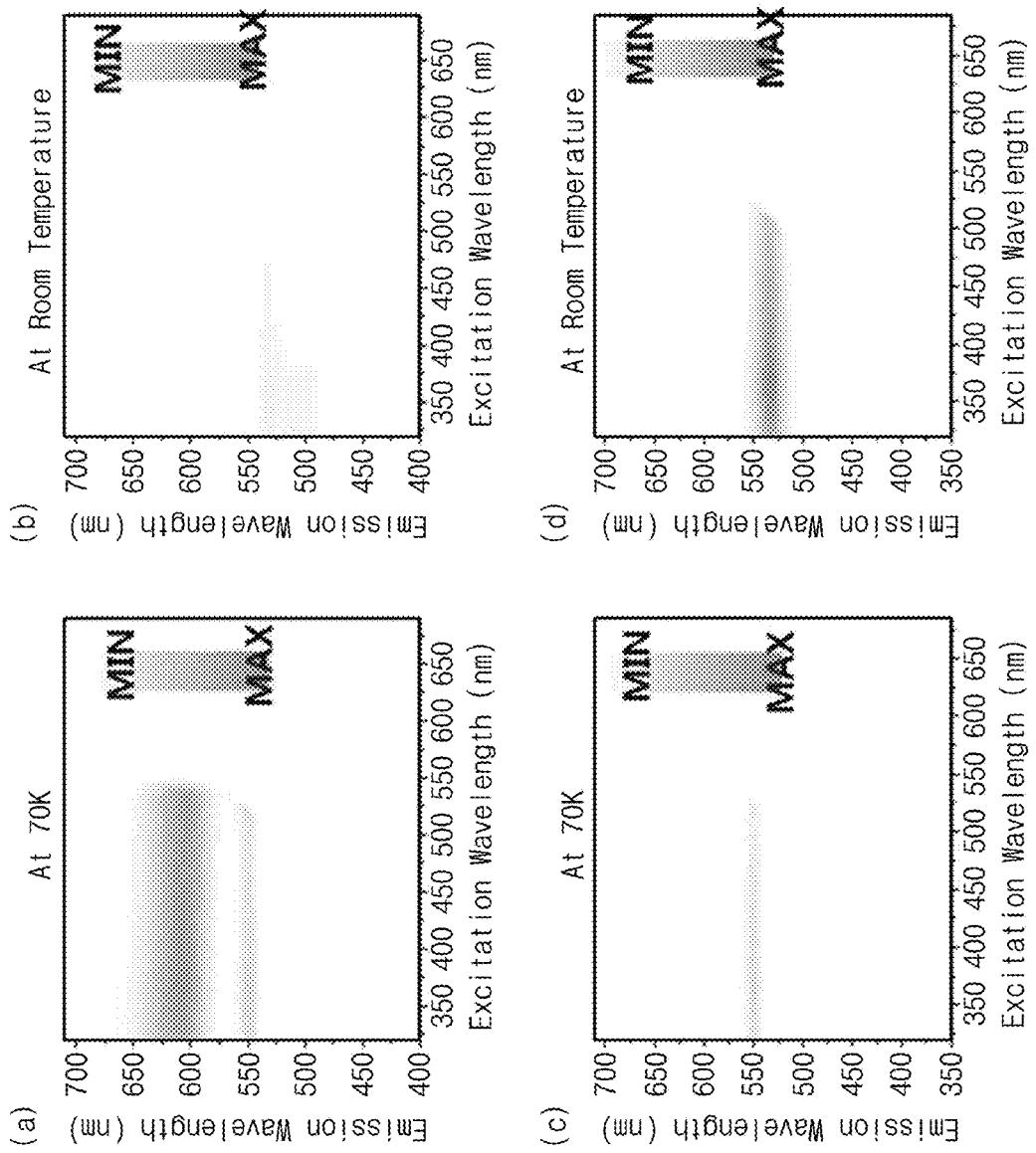
FIG. 9 is an image obtained by photographing a photoluminescence matrix of the light-emitter at room temperature and a low temperature according to Manufacturing Example 30 and Comparative Example 1.

FIG. 9 is an image obtained by photographing a photoluminescence matrix of the light-emitter at room temperature and a low temperature according to Manufacturing Example 30 and Comparative Example 1.

FIG. 9(a) is an image obtained by photographing a photographing a light emission matrix of the thin film-shaped hybrid perovskite (perovskite film) according to Comparative Example 1 at a low temperature (70K), and FIG. 9(b) is an image obtained by photographing a light emission matrix of the thin film-shaped hybrid perovskite (perovskite film) according to Comparative Example 1 at room temperature.

FIG. 9(c) is an image obtained by photographing a photoluminescence matrix of the thin film (perovskite-NP film) including the hybrid perovskite particle according to Manufacturing Example 1 at a low temperature (70K), and FIG. 9(d) is an image obtained by photographing a photoluminescence matrix of the thin film (perovskite-NP film) of the hybrid perovskite particle according to Manufacturing Example 1 at room temperature.

Referring to FIGS. 9(a) and 9(d), in case of the perovskite-NP film (perovskite-NP film) according to Manufacturing Example 1, it is seen that photoluminescence occurs at the same position as that of the perovskite film according to Comparative Example 1, and color purity is more improved. Also, in case of the perovskite-NP film according to Manufacturing Example 1, it is seen that photoluminescence having high color purity occurs at room temperature at the same position as that at the low temperature, and intensity of the light emission is not reduced. On the other hand, the hybrid perovskite according to Comparative Example 1 has different color purity and light emission position at room temperature and low temperature, and exciton does not emit light due to thermal ionization and delocalization of charge carriers at room temperature and thus is separated as free charge carriers and annihilated to cause low light emission intensity.

Figure 10:
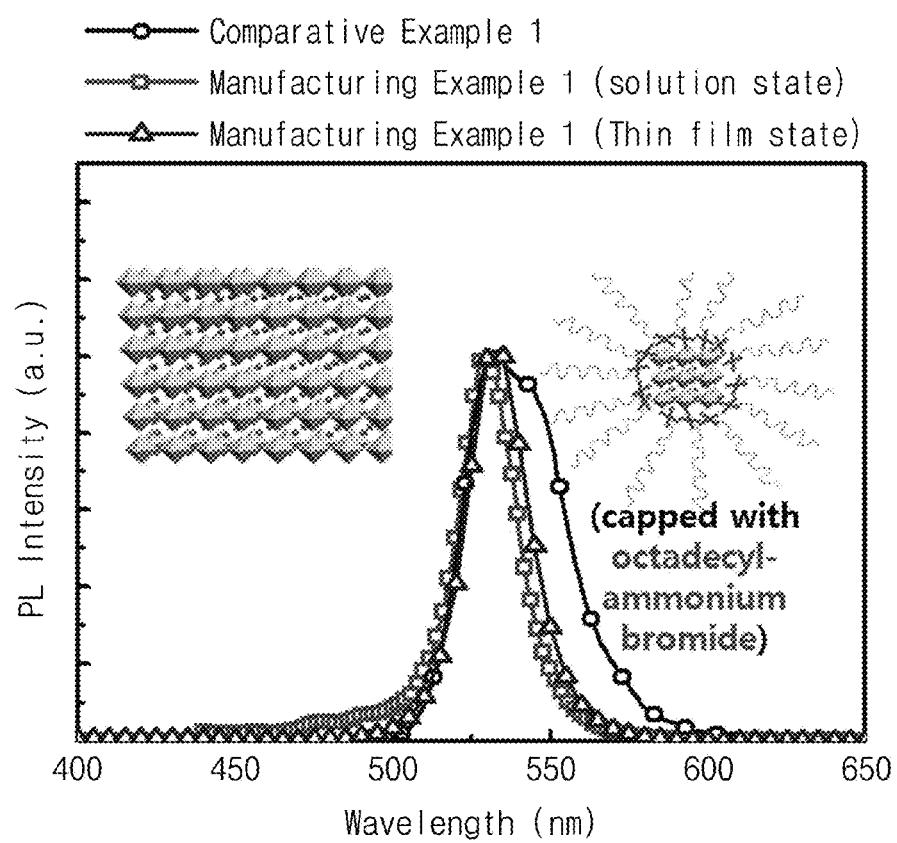
FIG. 10 is a graph obtained by photographing photoluminescence of the light-emitter according to Manufacturing Example 1 and Comparative Example 1.

FIG. 10 is a graph obtained by photographing photoluminescence of the light-emitter according to Manufacturing Example 1 and Comparative Example 1.

Referring to FIG. 10, in all cases of the liquid state in which the hybrid perovskite particle light-emitter is contained in the solution and the thin film state in which the thin film layer is formed by using the particle light-emitter according to Manufacturing Example 1, it is seen that the photoluminescence occurs at the same position as the hybrid perovskite according to Manufacturing Example 1.

FIG. 11 is a schematic view of the hybrid perovskite Particle light-emitter, in which the organic ligand is substituted, according to an embodiment of the present invention.

Referring to FIG. 11, the hybrid perovskite particle light-emitter 100 manufactured through the manufacturing methods of the present invention may be substituted with the organic ligand containing a hydrophobic a phenyl group or fluorine group, for example, fluorine ammonium. Thus, since the hybrid perovskite particle light-emitter is substituted with this kind of ligand, it is seen that the manufactured hybrid perovskite particle light-emitter 100' is more improved in durability (or stability).

In the particle light-emitter including the halide perovskite nanocrystal structure, the hybrid perovskite having the crystal structure, in which the FCC and the BCC are combined with each other, may be formed in the particle light-emitter to form a lamellar structure in which the organic plane and the inorganic plane are alternately stacked, and also, the excitons may be confined in the inorganic plane to implement the high color purity.

Also, the exciton diffusion length may be reduced, and the exciton binding energy may increase in the nanocrystal having a size of 900 nm or less to prevent the excitons from being annihilated by thermal ionization and the delocalization of the charge carriers, thereby improving the luminescent efficiency at room temperature.

Also, the bandgap energy of the hybrid perovskite particle may be determined by the crystal structure without depending on the particle size.

Furthermore, since the 2D hybrid perovskite is synthesized into the nanocrystal when compared to the 3D hybrid perovskite, the exciton binding energy may be improved to more improve the luminescent efficiency and the durability (or stability)

Also, the organic ligand surrounding the hybrid perovskite or inorganic metal halide perovskite nanocrystal may be substituted with the ligand having the short length or the ligand including the phenyl group or the fluorine group to more increase the energy transfer or the charge injection in the nanocrystal structure, thereby improving the luminescent efficiency and the durability (or stability) by the hydrophobic ligands.

It should be noted that the embodiments of the present invention disclosed in the present specification and drawings are only illustrative of specific examples for the purpose of understanding and are not intended to limit the scope of the present invention. It is to be understood by those skilled in the art that other modifications based on the technical idea of the present invention are possible in addition to the embodiments disclosed herein.

DESCRIPTION OF SYMBOLS

100: Hybrid perovskite particle light-emitter
100': Hybrid perovskite particle light-emitter in which organic ligand is substituted
110: Hybrid perovskite nanocrystal structure
120: First organic ligand 130: Second organic ligand

The invention claimed is:

1. A method for manufacturing a hybrid perovskite particle light-emitter, in which halide perovskite nanocrystal and a substituted organic ligand are included, the method comprising:
preparing a solution comprising the hybrid perovskite particle light-emitter including an halide perovskite nanocrystal structure and a plurality of first organic ligands surrounding a surface of the halide perovskite nanocrystal; and
substituting at least one of the first organic ligands with a second organic ligand, which has a length less than that of each of the first organic ligands;
wherein the second organic ligand comprises an element having affinity higher than that of the first organic ligands.

2. The method of claim 1, wherein the hybrid perovskite particle has a size of 1 nm to 900 nm.

3. The method of claim 1, wherein the hybrid perovskite particle has bandgap energy determined by the crystal structure without depending on a particle size.

4. The method of claim 1, wherein the preparing of the solution comprising the hybrid perovskite particle light-emitter comprises:
preparing a first solution in which hybrid perovskite is dissolved in a polar solvent and a second solution in which an alkyl halide surfactant is dissolved in a non-polar solvent; and
mixing the first solution with the second solution to form the hybrid perovskite particle light-emitter.

5. The method of claim 4, wherein the hybrid perovskite comprises a structure of $ABX_3$, $A_2BX_4$, $ABX_4$, $A_nBX_{2+n}$, $A_2BB'X_6$, or $A_{n-1}Pb_nX_{3n+1}$ (where n is an integer between 2 to 6), and the A is an organic ammonium material, the B or B' is a metal material, and the X is a halogen element.

6. The method of claim 5, wherein the A is $(CH_3NH_3)_n$, $((C_xH_{2x+1})_nNH_2)(CH_2NH_3)_n$, $(R(NH_3)_2$, $(C_nH_{2n+1}NH_3)_2$, $CF_3NH_3$, $(CF_3NH_3)_n$, $((C_xF_{2x+1})_nNH_2)(CF_2NH_3)_n$, $((C_xF_{2x-1})_nNH_3)$, metal, $(CH(NH_2)_2)$, $C_xH_{2x-1}(C(NH_2)_2)$, $(C_nF_{2n+1}NH_3)$ or derivative thereof (where n is an integer equal to or greater than 1, and x is an integer equal to or greater than 1),
the B or B' is a divalent transition metal, a rare earth metal, an alkali earth metal, Pb, Sn, Ge, Ga, In, Al, Sb, Bi, Po, or a combination thereof, and
the X is Cl, Br, I, or a combination thereof.

7. A hybrid perovskite particle light-emitter, in which an organic ligand is substituted, manufactured by the manufacturing method of claim 1.

8. The hybrid perovskite particle light-emitter of claim 7, wherein the hybrid perovskite particle light-emitter, in which an organic or inorganic ligand is substituted, is dispersible in an organic solvent or materials.

9. The hybrid perovskite particle light-emitter of claim 8, wherein the organic solvent comprises a polar solvent and a non-polar solvent,
the polar solvent comprises dimethylformamide, gamma butyrolactone, N-methylpyrrolidone, dimethylsulfoxide or isopropyl alcohol, and
the non-polar solvent comprises dichloroethylene, trichlorethylene, chloroform, chlorobenzene, dichlorobenzene, styrene, xylene, toluene, or cyclohexene.

10. A light emitting device comprising:
a first electrode;
a second electrode; and
a light emitting layer disposed between the first electrode and the second electrode and comprising the hybrid perovskite particle light-emitter, in which the organic ligand is substituted, of claim 7.

11. A solar cell comprising:
a first electrode;
a second electrode; and
a photoactive layer disposed between the first electrode and the second electrode and comprising the hybrid perovskite particle light-emitter, in which the organic ligand is substituted, of claim 7.

12. The method of claim 1, wherein each of the first organic ligands and the second organic ligand comprises alkyl halide, organic ammonium, or surfactant.

13. The method of claim 1, wherein halogen atom of second organic ligand has affinity higher than that of a halogen atom of the first organic ligands with respect to a center metal of the perovskite nanocrystal structure.

* * * * *